(12) United States Patent
Kusano et al.

(10) Patent No.: US 8,604,588 B2
(45) Date of Patent: Dec. 10, 2013

(54) SEMICONDUCTOR DEVICE AND SEMICONDUCTOR DEVICE FABRICATION

(75) Inventors: Kenichiro Kusano, Miyagi (JP); Junko Azami, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 289 days.

(21) Appl. No.: 13/031,705

(22) Filed: Feb. 22, 2011

(65) Prior Publication Data

US 2011/0204481 A1 Aug. 25, 2011

(30) Foreign Application Priority Data

Feb. 24, 2010 (JP) ................................. 2010-039208

(51) Int. Cl.
*H01L 29/66* (2006.01)
*H01L 21/02* (2006.01)

(52) U.S. Cl.
USPC ............ 257/536; 257/E29.166; 257/E21.004; 438/382

(58) Field of Classification Search
USPC ............ 257/536, E29.166, E21.004; 438/382
See application file for complete search history.

(56) References Cited

U.S. PATENT DOCUMENTS

2010/0090252 A1* 4/2010 Toyoshima et al. ........... 257/203

FOREIGN PATENT DOCUMENTS

JP 2005-142531 6/2005

* cited by examiner

*Primary Examiner* — Whitney T Moore
(74) *Attorney, Agent, or Firm* — Volentine & Whitt, PLLC

(57) ABSTRACT

A semiconductor device including: a first resistance element formed of a first polysilicon layer that contains impurities; a second resistance element provided on a same surface as the first polysilicon layer, and formed of a second polysilicon layer that contains an equal amount of impurities to the first polysilicon layer; a first interlayer insulation film provided so as to cover the first resistance element and the second resistance element; and a first metal layer provided on the first interlayer insulation film so as to cover the second resistance element with the first interlayer insulation film disposed therebetween.

19 Claims, 13 Drawing Sheets

SEMICONDUCTOR DEVICE AND SEMICONDUCTOR DEVICE FABRICATION

CROSS-REFERENCE TO RELATED APPLICATION

This application is based on and claims priority under 35 USC 119 from Japanese Patent Application No. 2010-039208 filed Feb. 24, 2010, the disclosure of which is incorporated by reference herein.

BACKGROUND

1. Technical Field

The present invention relates to a semiconductor device and a semiconductor device fabrication method.

2. Related Art

Heretofore, when a resistance element is to be formed in an integrated circuit of a semiconductor device, for example, a polysilicon layer is formed and then the resistance thereof is adjusted by doping the polysilicon layer with impurities to form the resistance element (for example, see Japanese Patent Application Laid-Open (JP-A) No. 2005-142531). Thus, the resistance value is controlled by an amount of impurities in the polysilicon layer.

However, because the resistance value of the polysilicon layer is controlled by the amount of doped (implanted) impurities, when resistance elements with different resistance values are to be produced, a mask for impurity doping (known as an implantation mask) must be prepared for each target resistance value, and the impurities injected into the polysilicon layer using the respective masks for impurity doping such that different impurity amounts result. This situation causes costs.

SUMMARY

Accordingly, an object of the present invention is to provide a semiconductor device including plural resistance elements that are formed of plural polysilicon layers with matching impurity amounts and that have different resistance values.

Further, a semiconductor device fabrication method is to be provided that provides this semiconductor device simply and at low cost.

A first aspect of the present invention is a semiconductor device including: a first resistance element formed of a first polysilicon layer that contains impurities; a second resistance element provided on a same surface as the first polysilicon layer, and formed of a second polysilicon layer that contains an equal amount of impurities to the first polysilicon layer; a first interlayer insulation film provided so as to cover the first resistance element and the second resistance element; and a first metal layer provided on the first interlayer insulation film so as to cover the second resistance element with the first interlayer insulation film disposed therebetween.

A second aspect of the present invention is a semiconductor device fabrication method including: a polysilicon layer formation step of forming a first polysilicon layer and a second polysilicon layer on a same surface; a resistance element formation step of forming a first resistance element formed of the first polysilicon layer and containing impurities and a second resistance element formed of the second polysilicon layer and containing an equal amount of impurities to the first polysilicon layer by respectively doping the first polysilicon layer and the second polysilicon layer with the impurities under identical conditions; a first interlayer insulation film formation step of forming a first interlayer insulation film so as to cover the first resistance element and the second resistance element; and a first metal layer formation step of forming a first metal layer on the first interlayer insulation film so as to cover the second resistance element with the first interlayer insulation film disposed therebetween.

According to the present invention, a semiconductor device including plural resistance elements that are formed of plural polysilicon layers with matching impurity amounts and that have different resistance values may be provided.

Further, according to the present invention, a semiconductor device fabrication method that provides this semiconductor device simply and at low cost may be provided.

BRIEF DESCRIPTION OF THE DRAWINGS

Exemplary embodiments of the present invention will be described in detail based on the following figures, wherein.

DETAILED DESCRIPTION

Figure 1:
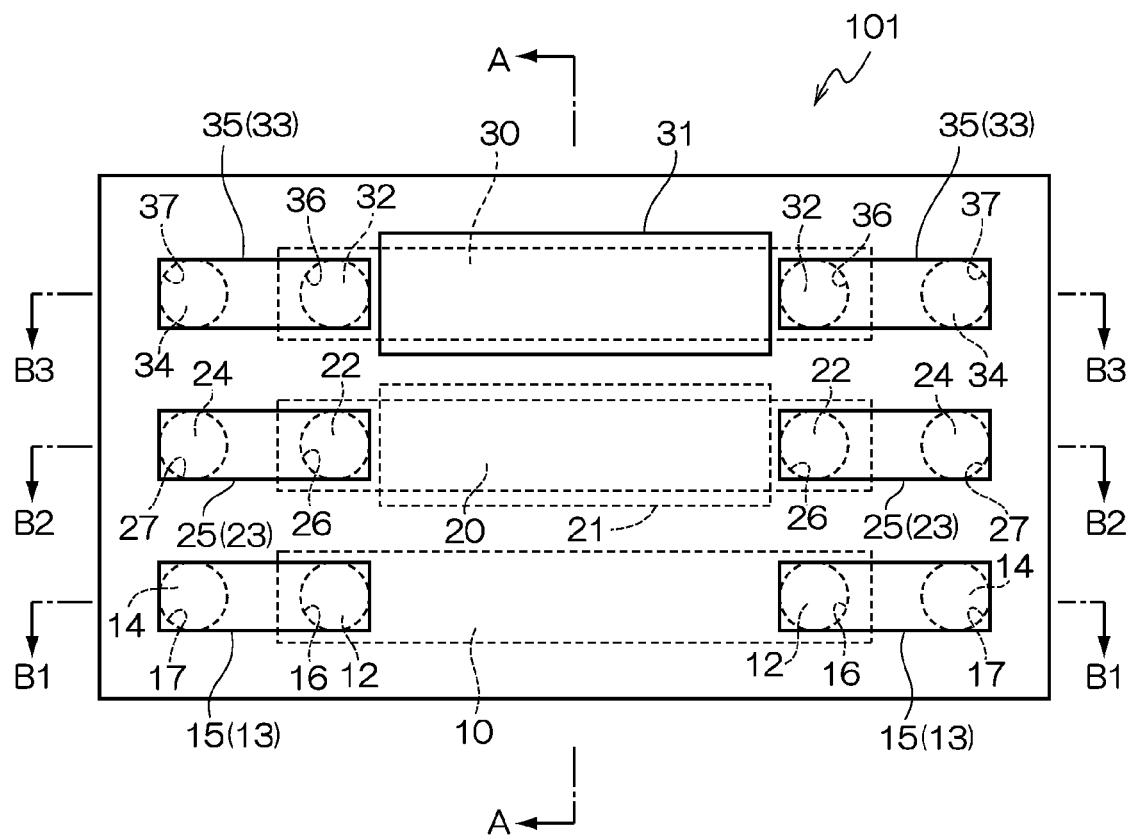
FIG. 1 is a schematic plan view illustrating a semiconductor device according to a first exemplary embodiment.

Herebelow, exemplary embodiments of the present invention are described with reference to the attached drawings.

Herein, portions that have essentially the same functions are assigned the same reference numerals throughout the drawings, and duplicative descriptions may be omitted.

[First Exemplary Embodiment]

Figure 2:
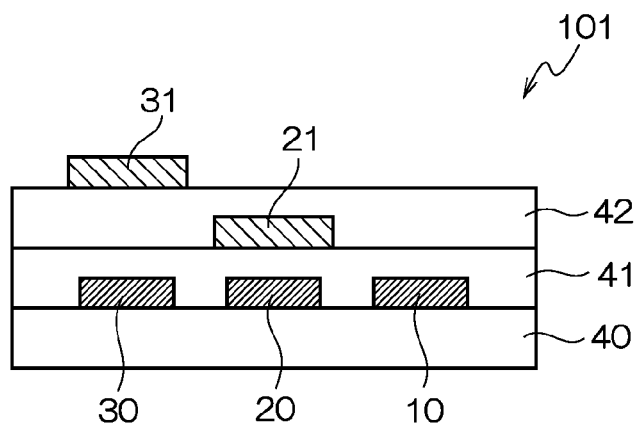
FIG. 2 is a schematic sectional diagram illustrating the semiconductor device according to the first exemplary embodiment.

FIG. 1 is a schematic plan view illustrating a semiconductor device according to the first exemplary embodiment. FIG. 2 is a schematic sectional diagram illustrating the semiconductor device according to the first exemplary embodiment. FIG. 3 is schematic sectional diagrams illustrating the semiconductor device according to the first exemplary embodiment.

Figure 3A:
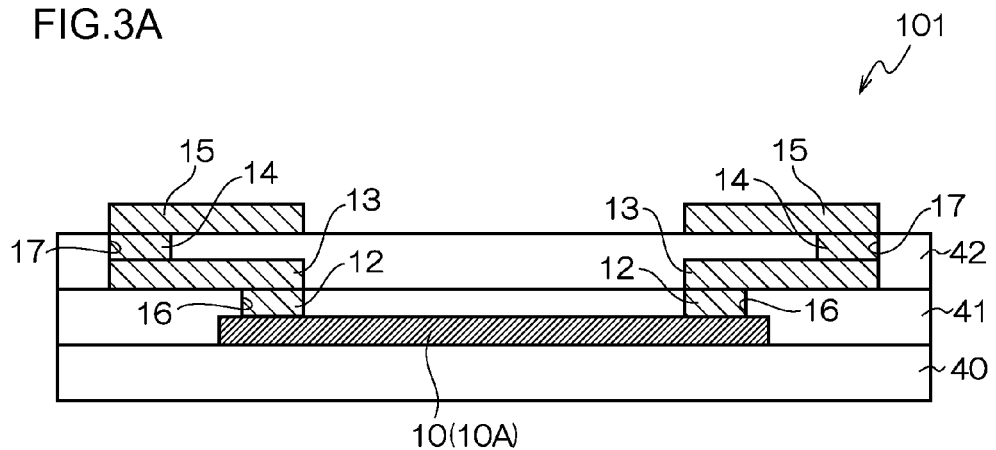
FIG. 3A to FIG. 3C are schematic sectional diagrams illustrating the semiconductor device according to the first exemplary embodiment.
Figure 3B:
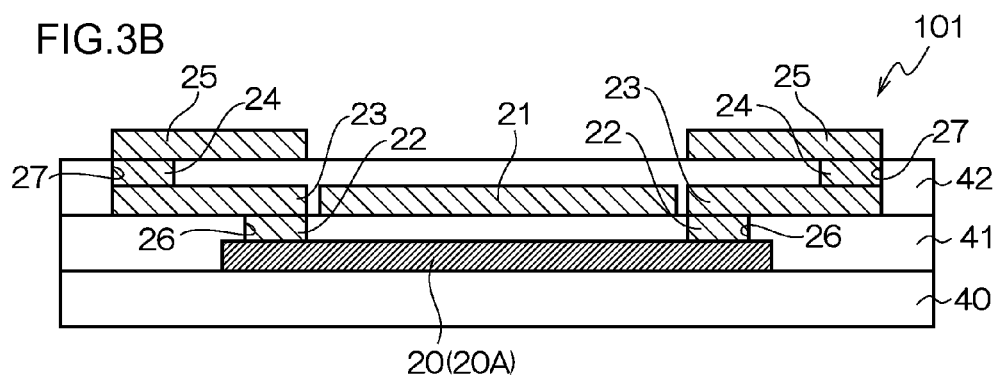
Figure 3C:
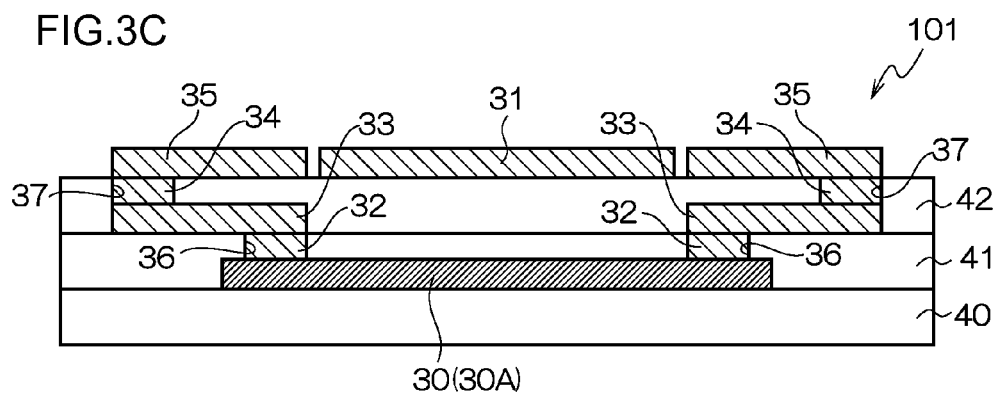

FIG. 2 shows a schematic sectional diagram taken along line A-A of FIG. 1. FIG. 3A shows a schematic sectional diagram taken along line B1-B1 of FIG. 1. FIG. 3B shows a schematic sectional diagram taken along line B2-B2 of FIG. 1. Further, FIG. 3C shows a schematic sectional diagram taken along line B3-B3 of FIG. 1.

As illustrated in FIG. 1 to FIG. 3C, a semiconductor device 101 according to the first exemplary embodiment is provided with a first resistance element 10, a second resistance element 20 and a third resistance element 30, on the same face of a semiconductor substrate 40 (for example, a silicon substrate). The first resistance element 10 is formed of a strip-form first polysilicon layer 10A, the second resistance element 20 is formed of a strip-form second polysilicon layer 20A and the third resistance element 30 is formed of a strip-form third polysilicon layer 30A.

The first polysilicon layer 10A structuring the first resistance element 10, the second polysilicon layer 20A structuring the second resistance element 20 and the third polysilicon layer 30A structuring the third resistance element 30 are all doped with impurities by ion implantation for resistance adjustment. The amounts of implanted impurities (implantation dose amounts) are equal to one another (being considered to be equal if the implantation dose amounts are within ±1.5%).

A first interlayer insulation film 41 is formed on the semiconductor substrate 40 (for example, a silicon substrate) so as to cover the first resistance element 10, the second resistance element 20 and the third resistance element 30.

Two contact holes 16 are provided so as to penetrate through the first interlayer insulation film 41. The contact holes 16 are for enabling electrical connection with two length direction end portions of the first resistance element 10. The interiors of the contact holes 16 are filled in with metal materials 12 (for example, tungsten (W), copper (Cu), aluminum (Al) or the like). Wiring layers 13 are provided on the first interlayer insulation film 41 so as to connect with the metal materials 12.

Similarly, two contact holes 26 are provided so as to penetrate through the first interlayer insulation film 41. The contact holes 26 are for enabling electrical connection with two length direction end portions of the second resistance element 20. The interiors of the contact holes 26 are filled in with metal materials 22 (for example, tungsten (W), copper (Cu), aluminum (Al) or the like). Wiring layers 23 are provided on the first interlayer insulation film 41 so as to connect with the metal materials 22.

Similarly, two contact holes 36 are provided so as to penetrate through the first interlayer insulation film 41. The contact holes 36 are for enabling electrical connection with two length direction end portions of the third resistance element 30. The interiors of the contact holes 36 are filled in with metal materials 32 (for example, tungsten (W), copper (Cu), aluminum (Al) or the like). Wiring layers 33 are provided on the first interlayer insulation film 41 so as to connect with the metal materials 32.

The wiring layers 13, 23 and 33 are provided, for example, to extend over regions on the first interlayer insulation film 41, except in regions between the respective pairs of length direction end portions of the first resistance element 10, second resistance element 20 and third resistance element 30, at which the contact holes are provided. Namely, the wiring layers 13, 23, and 33 extend, on the interlayer insulation film, from the regions where the contact holes are provided to the region where the contact holes and the resistance elements are not provided.

On the first interlayer insulation film 41, a first metal layer 21 (for example, a layer of tungsten (W), copper (Cu), aluminum (Al) or the like) is provided so as to cover only the second resistance element 20, with the first interlayer insulation film 41 therebetween.

Specifically, the first metal layer 21 is provided so as to cover over a region of the second resistance element 20 that functions as a resistance element, which is the region sandwiched by the two length direction end portions at which the contact holes 26 are provided. The first metal layer 21 is provided such that a width thereof is wider than the second resistance element 20 (the second polysilicon layer 20A) and covers only the second resistance element 20, with the first interlayer insulation film 41 therebetween. In other words, the first metal layer 21 is provided so as to be superimposed, if projected in the direction of layering of the layers, with the region of the second resistance element 20 that is sandwiched by the two length direction end portions at which the contact holes 26 are provided.

Thus, the first metal layer 21 is provided so as not to cover over the first resistance element 10 (the first polysilicon layer 10A) and the third resistance element 30 (the third polysilicon layer 30A).

The first metal layer 21 is provided to be separate from the wiring layers 13, 23 and 33.

The first metal layer 21 may be constituted of the same material as the wiring layers 13, 23 and 33, but may be different.

With the first metal layer 21, a second interlayer insulation film 42 is provided on the first interlayer insulation film 41 so as to cover the wiring layers 13, 23 and 33. Namely, the second interlayer insulation film 42 is provided both so as to cover the first resistance element 10, the second resistance element 20 and the third resistance element 30 with the first interlayer insulation film 41 therebetween, and so as to cover the first metal layer 21 and the wiring layers 13, 23 and 33.

Contact holes 17 are respectively provided so as to penetrate through the second interlayer insulation film 42. The contact holes 17 are for enabling electrical connections with the two wiring layers 13 (the wiring layers 13 electrically connected to the first resistance element 10). The interiors of the contact holes 17 are filled in with metal materials 14 (for example, tungsten (W), copper (Cu), aluminum (Al) or the like). Wiring layers 15 are provided on the second interlayer insulation film 42 so as to connect with the metal materials 14.

Similarly, contact holes 27 are respectively provided so as to penetrate through the second interlayer insulation film 42. The contact holes 27 are for enabling electrical connections with the two wiring layers 23 (the wiring layers 23 electrically connected to the second resistance element 20). The interiors of the contact holes 27 are filled in with metal materials 24 (for example, tungsten (W), copper (Cu), aluminum (Al) or the like). Wiring layers 25 are provided on the second interlayer insulation film 42 so as to connect with the metal materials 24.

Similarly, contact holes 37 are respectively provided so as to penetrate through the second interlayer insulation film 42.

The contact holes 37 are for enabling electrical connections with the two wiring layers 33 (the wiring layers 33 electrically connected to the third resistance element 30). The interiors of the contact holes 37 are filled in with metal materials 34 (for example, tungsten (W), copper (Cu), aluminum (Al) or the like). Wiring layers 35 are provided on the second interlayer insulation film 42 so as to connect with the metal materials 34.

The wiring layers 15, 25 and 35 are provided, for example, on the second interlayer insulation film 42 so as to extend over regions that exclude regions of the first resistance element 10, second resistance element 20, and third resistance element 30, that are sandwiched between the respective pairs of length direction end portions at which the contact holes are provided.

On the second interlayer insulation film 42, a second metal layer 31 (for example, a layer of tungsten (W), copper (Cu), aluminum (Al) or the like) is provided so as to cover only the third resistance element 30, with the first interlayer insulation film 41 and the second interlayer insulation film 42 therebetween.

Specifically, the second metal layer 31 is provided so as to cover over a region of the third resistance element 30 that functions as a resistance element, which is the region sandwiched by the two length direction end portions at which the contact holes 36 are provided. The second metal layer 31 is provided such that a width thereof is wider than the third resistance element 30 (the third polysilicon layer 30A) and covers only the third resistance element 30, with the first interlayer insulation film 41 and the second interlayer insulation film 42 therebetween. In other words, the second metal layer 31 is provided so as to be superimposed, if projected in the direction of layering of the layers, with the region of the third resistance element 30 that is sandwiched by the two length direction end portions at which the contact holes 36 are provided.

Thus, the second metal layer 31 is provided so as not to cover over the first resistance element 10 (the first polysilicon layer 10A) and the second resistance element 20 (the second polysilicon layer 20A).

The second metal layer 31 is provided to be separate from the wiring layers 15, 25 and 35.

The second metal layer 31 may be constituted of the same material as the wiring layers 15, 25 and 35, but may be different.

On the second interlayer insulation film 42, an interlayer insulation film including contact holes formed therein, a wiring layer, and/or suchlike (not illustrated), may be further formed.

Next, a fabrication method of the semiconductor device according to the first exemplary embodiment is described.

FIG. 4A to FIG. 9C are process diagrams illustrating the semiconductor device fabrication method according to the first exemplary embodiment.

FIG. 4A to FIG. 5C are process diagrams corresponding to sectional views taken along line B1-B1 of FIG. 1. FIG. 6A to FIG. 7C are process diagrams corresponding to sectional views taken along line B2-B2 of FIG. 1. FIG. 8A to FIG. 9C are process diagrams corresponding to sectional views taken along line B3-B3 of FIG. 1.

Figure 4A:
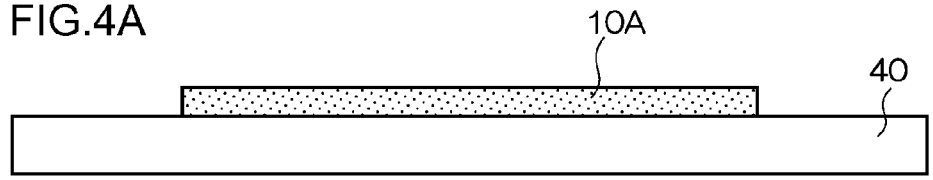
FIG. 4A to FIG. 4E are process diagrams illustrating a semiconductor device fabrication method according to the first exemplary embodiment.
Figure 6A:
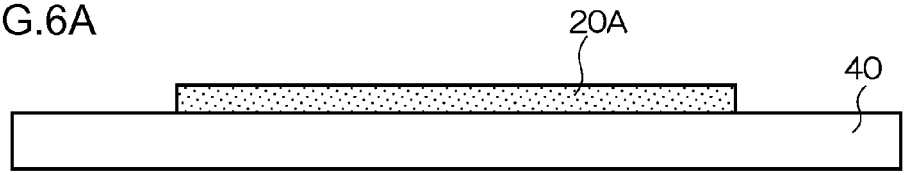
FIG. 6A to FIG. 6E are process diagrams illustrating the semiconductor device fabrication method according to the first exemplary embodiment.
Figure 8A:
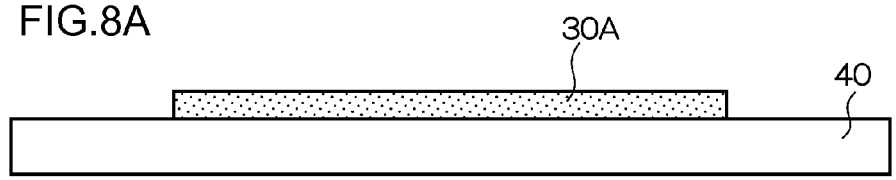
FIG. 8A to FIG. 8E are process diagrams illustrating the semiconductor device fabrication method according to the first exemplary embodiment.

Firstly, as illustrated in FIG. 4A, FIG. 6A and FIG. 8A, the semiconductor substrate 40 (for example, a silicon substrate) is prepared. Then, polysilicon is deposited by low-pressure chemical vapor deposition (LP-CVD), and is formed into a layer on a predetermined region of the semiconductor substrate 40. Thereafter, on the formed layer, patterning is performed by photolithography and etching, and accordingly, the strip-form first polysilicon layer 10A, the strip-form second polysilicon layer 20A and the strip-form third polysilicon layer 30A are formed.

Figure 4B:
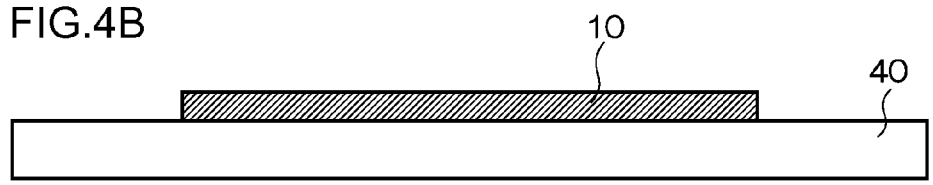
Figure 6B:
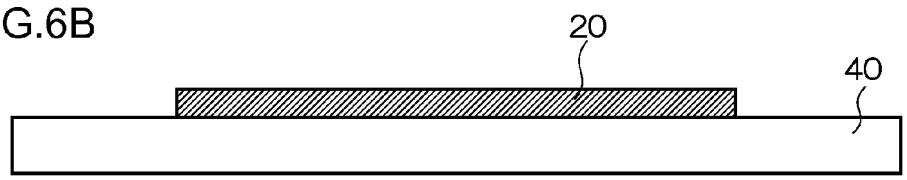
Figure 8B:

Next, as illustrated in FIG. 4B, FIG. 6B and FIG. 8B, patterning is performed on the semiconductor substrate 40 by photolithography and etching, and a resist layer with predetermined apertures is formed. Thereafter, impurities (impurity ions which are, for example, phosphorus ions ($P^+$) or the like) are injected into the strip-form first polysilicon layer 10A, the strip-form second polysilicon layer 20A and the strip-form third polysilicon layer 30A, with the resist layer serving as a mask (an implantation mask). This impurity doping is performed once, and is performed under the same conditions for each polysilicon layer.

Thus, the first resistance element 10 formed of the first polysilicon layer 10A, the second resistance element 20 formed of the second polysilicon layer 20A and the third resistance element 30 formed of the third polysilicon layer 30A are formed simultaneously. In these conditions, the first to third resistance elements are structured by the polysilicon layer that contain impurities with matching impurity amounts, and therefore have the first to third resistance elements equal resistance values.

Figure 4C:
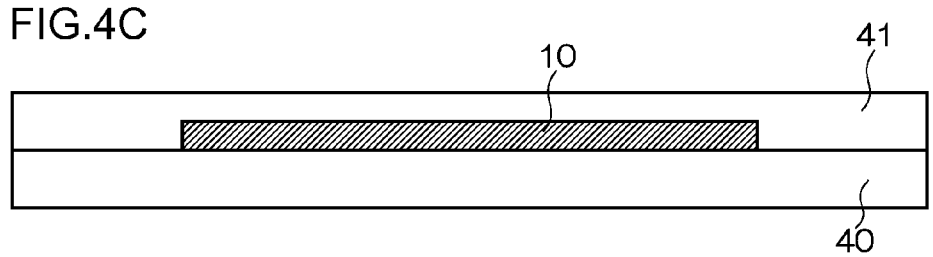
Figure 6C:
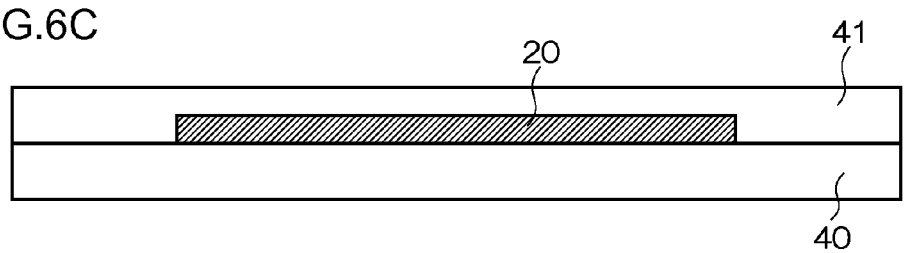
Figure 8C:
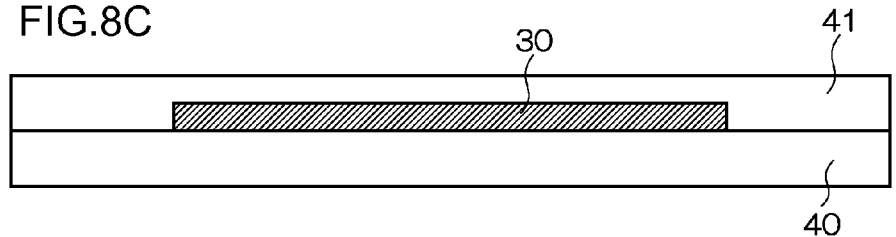

Next, as illustrated in FIG. 4C, FIG. 6C and FIG. 8C, the first interlayer insulation film 41 is formed on the semiconductor substrate 40 by, for example, vapor deposition of, for example, a phosphorus-containing silicon oxide layer (a PSG layer) or the like, so as to cover the first resistance element 10 (the first polysilicon layer 10A), the second resistance element 20 (the second polysilicon layer 20A) and the third resistance element 30 (the third polysilicon layer 30A).

Figure 4D:
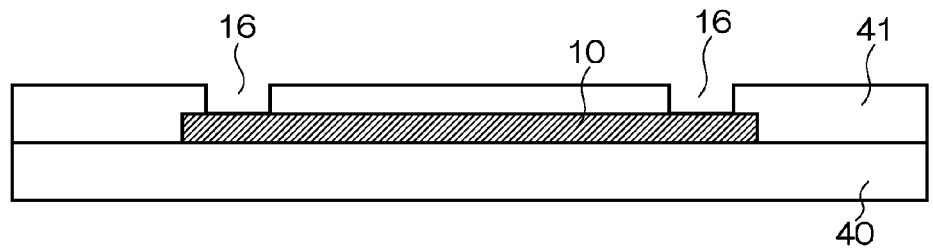
Figure 6D:
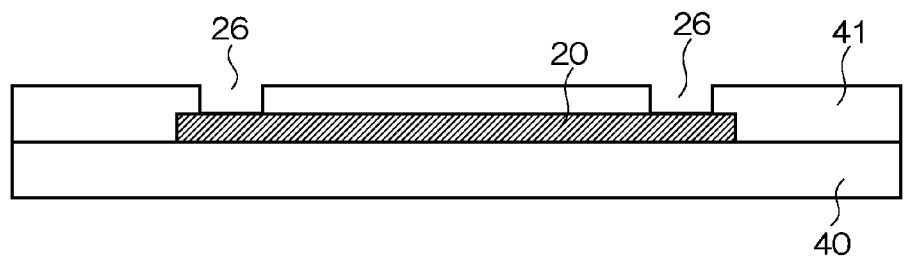
Figure 8D:
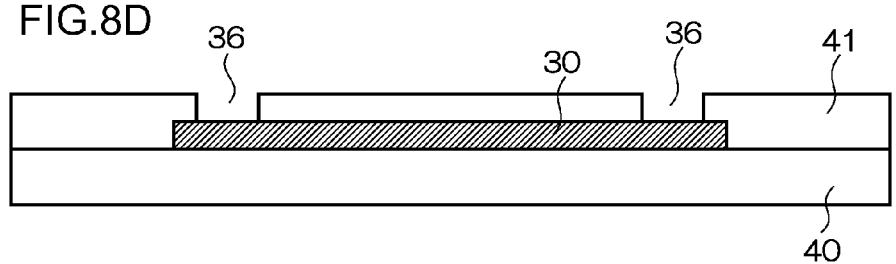

Then, as illustrated in FIG. 4D, FIG. 6D, and FIG. 8D, the contact holes 16 are formed in the first interlayer insulation film 41 by photolithography and etching, so as to enable contacts with the two length direction end portions of the first resistance element 10 (the first polysilicon layer 10A).

At the same time, the contact holes 26 are formed in the first interlayer insulation film 41 by photolithography and etching, so as to enable contacts with the two length direction end portions of the second resistance element 20 (the second polysilicon layer 20A). Similarly, the contact holes 36 are formed by photolithography and etching, so as to enable contacts with the two length direction end portions of the third resistance element 30 (the third polysilicon layer 30A).

Figure 4E:
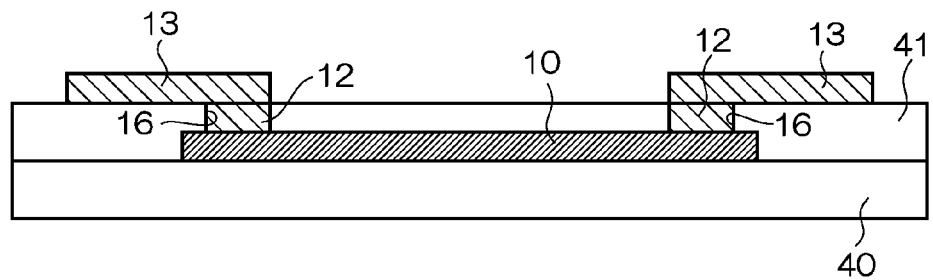
Figure 6E:
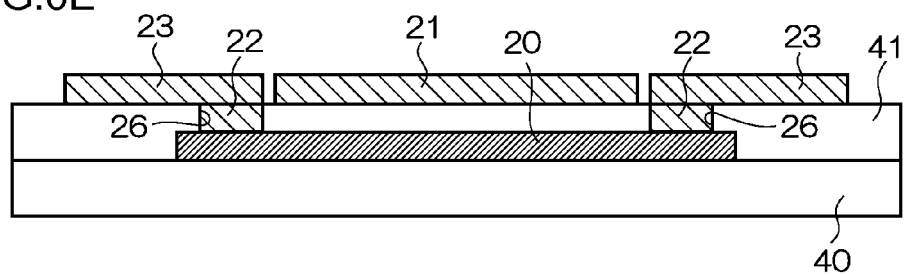
Figure 8E:
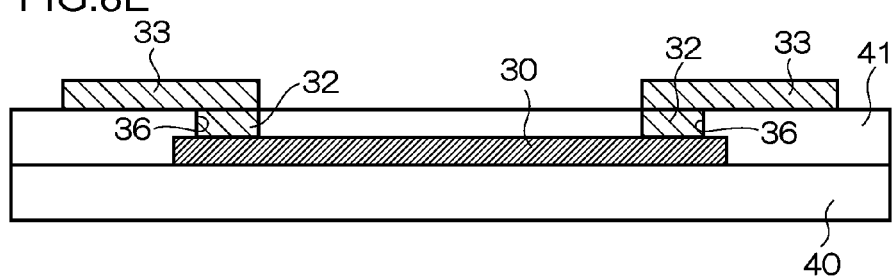

Next, as illustrated in FIG. 4E, FIG. 6E and FIG. 8E, the contact holes 16, 26 and 36 formed in the first interlayer insulation film 41 are filled in with the metal materials 12, 22 and 32 (which are, for example, tungsten (W), copper (Cu), aluminum (Al) or the like), respectively, by chemical vapor deposition (CVD), sputtering or the like. Together therewith, a metal material (for example, tungsten (W), copper (Cu), aluminum (Al) or the like) is deposited on the first interlayer insulation film 41 to form a layer. Thereafter, the layer of metal material deposited on the first interlayer insulation film 41 is subjected to patterning by photolithography and etching, and accordingly, the wiring layers 13, 23 and 33 are formed.

When this patterning of the layer of metal material deposited on the first interlayer insulation film 41 is carried out, the patterning is performed such that a region covering only the second resistance element 20, with the first interlayer insulation film 41 therebetween, remains. This remaining layer of the metal material is the first metal layer 21.

Figure 5A:
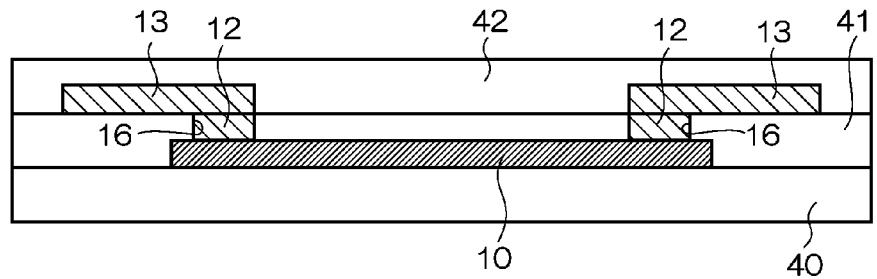
FIG. 5A to FIG. 5C are process diagrams illustrating the semiconductor device fabrication method according to the first exemplary embodiment.
Figure 7A:
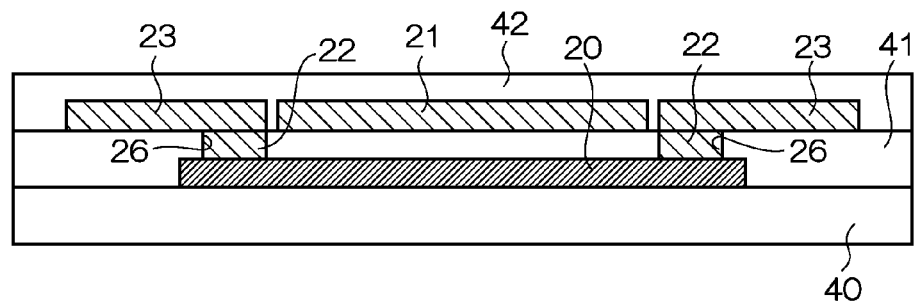
FIG. 7A to FIG. 7C are process diagrams illustrating the semiconductor device fabrication method according to the first exemplary embodiment.
Figure 9A:
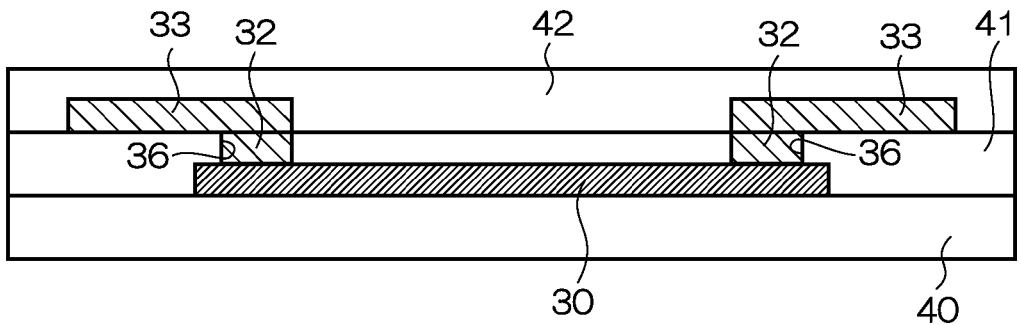
FIG. 9A to FIG. 9C are process diagrams illustrating the semiconductor device fabrication method according to the first exemplary embodiment.

Next, as illustrated in FIG. 5A, FIG. 7A and FIG. 9A, the second interlayer insulation film 42 is formed on the first interlayer insulation film 41 by, for example, vapor deposition of, for example, a phosphorus-containing silicon oxide layer (a PSG layer) or the like, so as to cover both the first metal layer 21 and the wiring layers 13, 23 and 33.

Figure 5B:
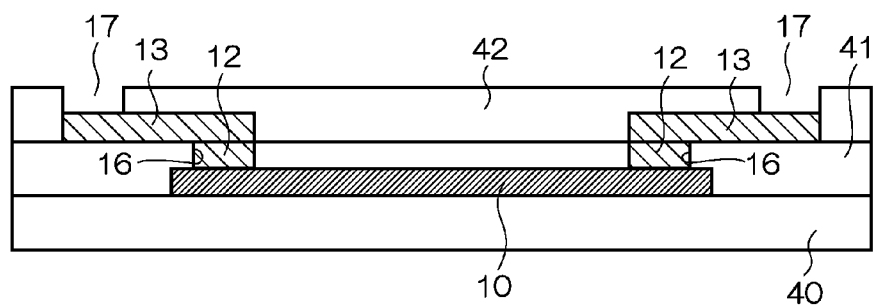
Figure 7B:
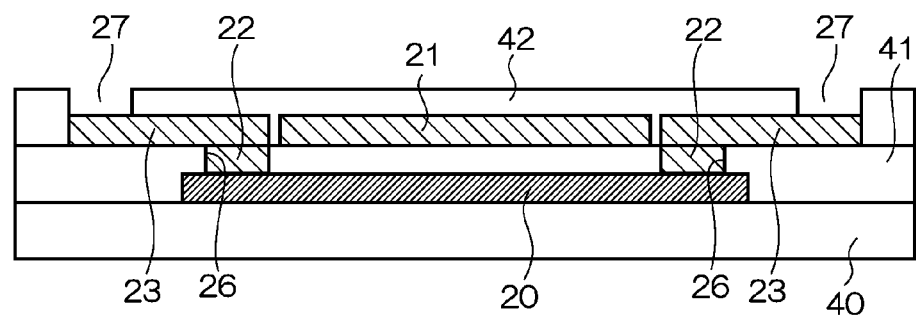
Figure 9B:
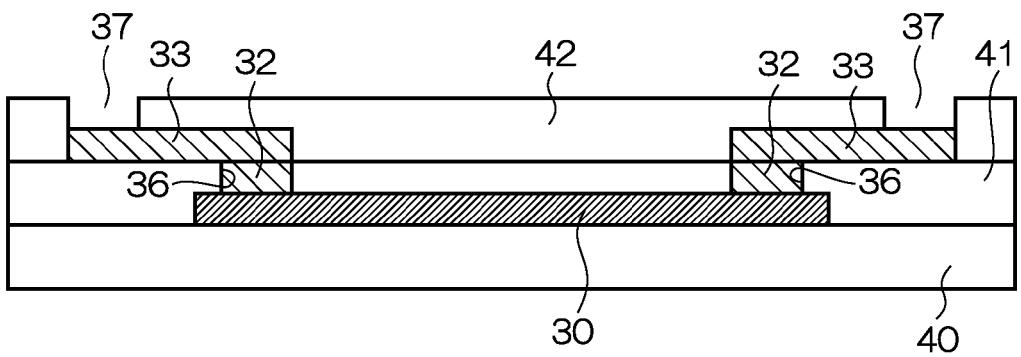

Then, as illustrated in FIG. 5B, FIG. 7B and FIG. 9B, the contact holes 17 are formed in the second interlayer insulation film 42 by photolithography and etching, so as to enable electrical contacts with the two wiring layers 13 (the wiring layers 13 electrically connected to the first resistance element 10).

At the same time, the contact holes 27 are formed in the first interlayer insulation film 41 by photolithography and etching, so as to enable contacts with the two wiring layers 23 (the wiring layers 23 electrically connected to the second resistance element 20). Similarly, the contact holes 37 are formed by photolithography and etching, so as to enable contacts with the two wiring layers 33 (the wiring layers 33 electrically connected to the third resistance element 30).

Figure 5C:
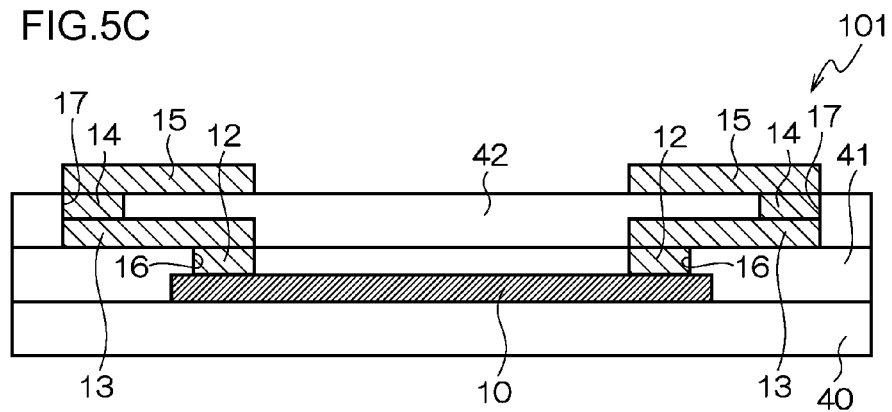
Figure 7C:
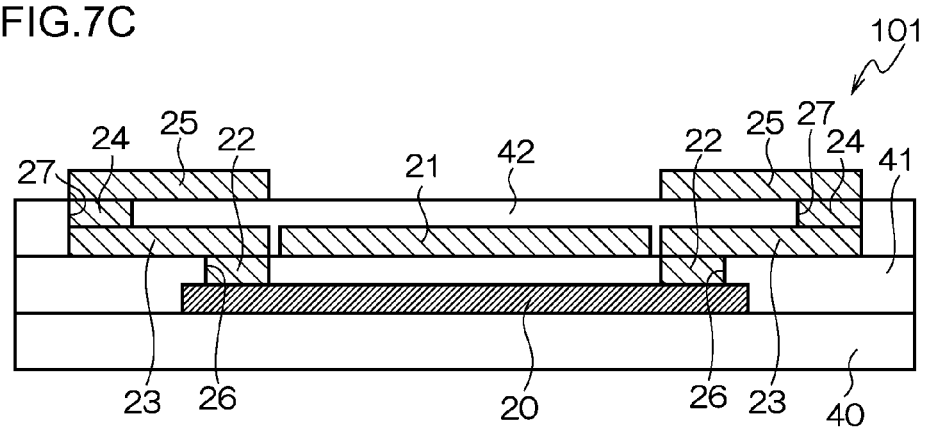
Figure 9C:
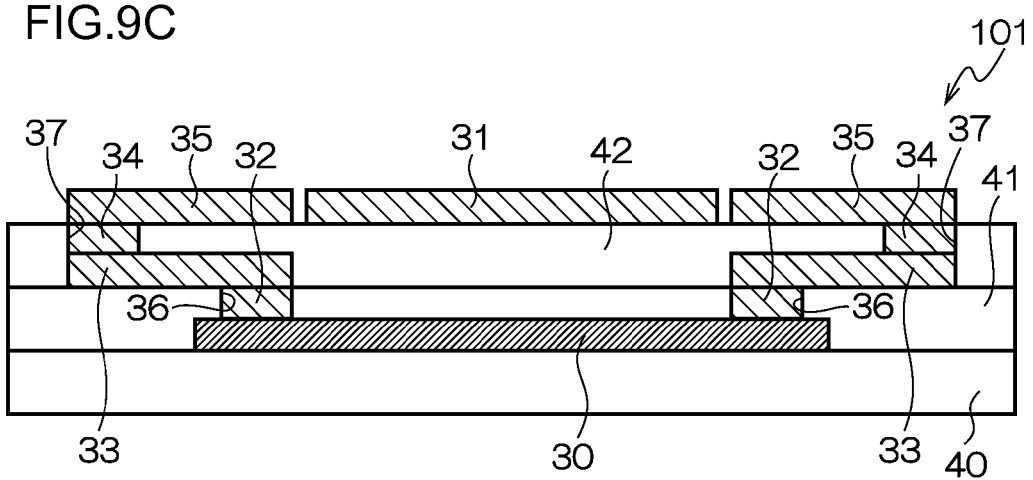

Next, as illustrated in FIG. 5C, FIG. 7C and FIG. 9C, the contact holes 17, 27 and 37 formed in the second interlayer insulation film 42 are filled in with the metal materials 14, 24 and 34 (which are, for example, tungsten (W), copper (Cu), aluminum (Al) or the like), respectively, by chemical vapor deposition (CVD), sputtering or the like. Together therewith, a metal material (for example, tungsten (W), copper (Cu), aluminum (Al) or the like) is deposited on the second interlayer insulation film 42 to form a layer. Thereafter, the layer of metal material deposited on the second interlayer insulation film 42 is subjected to patterning by photolithography and etching, and accordingly, the wiring layers 15, 25 and 35 are formed.

When this patterning of the layer of metal material deposited on the second interlayer insulation film 42 is carried out, the patterning is performed such that a region covering only the third resistance element 30, with the first interlayer insulation film 41 and the second interlayer insulation film 42 therebetween, remains. This remaining layer of the metal material is the second metal layer 31.

Thereafter, if required, an interlayer insulation layer may be formed on the second interlayer insulation film 42 and further contact holes, wiring layers and the like may be formed.

By the steps described above, the semiconductor device 101 according to the present exemplary embodiment is fabricated.

The semiconductor device 101 according to the first exemplary embodiment described above, is provided with the first resistance element 10 formed of the first polysilicon layer 10A containing impurities, and the second resistance element 20 that is provided on the same surface as the first polysilicon layer 10A and is formed of the second polysilicon layer 20A with an impurity amount the same as in the first polysilicon layer 10A.

Further, the first metal layer 21 is provided on the first interlayer insulation film 41 and covers the second polysilicon layer 20A (the second resistance element 20) with the first interlayer insulation film 41 therebetween.

When the first metal layer 21 is formed over the second polysilicon layer 20A (the second resistance element 20) with the first interlayer insulation film 41 therebetween, stress acts on the second polysilicon layer 20A (the second resistance element 20) in a direction of compression. In the case of polysilicon, when stress acts in the compression direction, if the carriers are electrons, electron mobility decreases, and consequently the resistance value of the second resistance element 20 (the second polysilicon layer 20A) rises.

Figure 10:
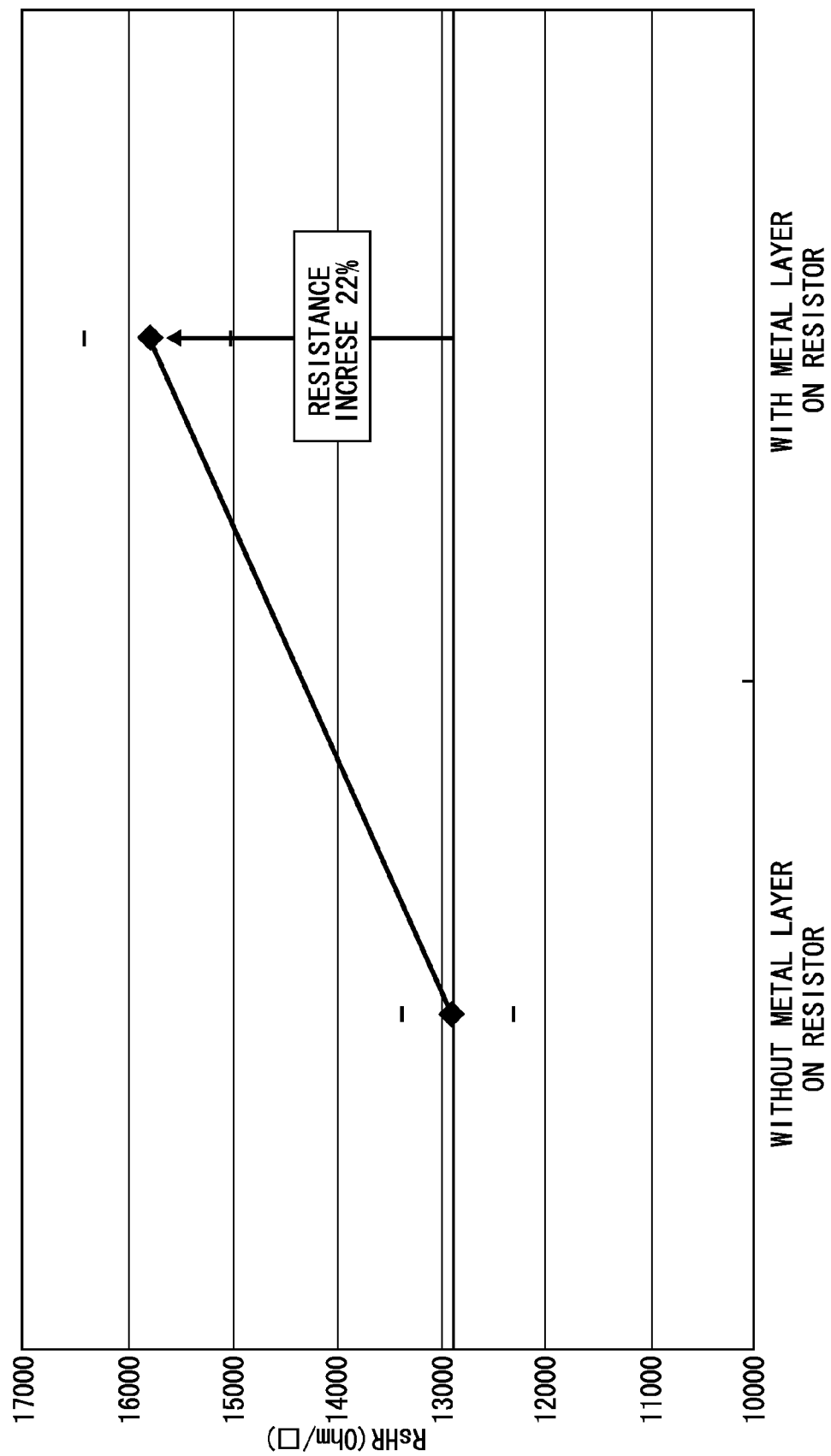
FIG. 10 is a graph illustrating that a rise in resistance of a resistance element formed of a polysilicon layer occurs when a metal layer is formed over the resistance element so as to cover the resistance element with an interlayer insulation film therebetween.

FIG. 10 shows a graph illustrating that a rise in resistance of a resistance element formed of a polysilicon layer, when a metal layer is formed over the resistance element so as to cover the resistance element with an interlayer insulation film therebetween. As illustrated in FIG. 10, the resistance value rises by approximately 20% or more, when the metal layer is formed over the resistance element formed of the polysilicon layer so as to cover the resistance element with the interlayer insulation film therebetween.

Note that FIG. 10 is a graph of a case in which the polysilicon layer has a thickness of 0.2 µm, a width of 2.0 µm and a length of 40.0 µm, a silicon dioxide layer with a thickness of 0.8 µm is employed as the interlayer insulation film, and an aluminum layer with a thickness of 0.4 µm is employed as the metal layer.

Thus, even though the impurity amounts in the polysilicon layers are the same, the first resistance element 10 and the second resistance element 20 are resistance elements with different resistance values.

The semiconductor device 101 according to the present exemplary embodiment includes, as well as the first resistance element 10 and the second resistance element 20, the third resistance element 30 that is provided on the same surface as the first polysilicon layer 10A and is formed of the third polysilicon layer 30A with an impurity amount the same as in the first polysilicon layer 10A.

Further, the second metal layer 31 is provided on the second interlayer insulation film 42 and covers the third polysilicon layer 30A (the third resistance element 30) with the first interlayer insulation film 41 and the second interlayer insulation film 42 therebetween.

When the second metal layer 31 is formed over the third polysilicon layer 30A (the third resistance element 30) with the first interlayer insulation film 41 and the second interlayer insulation film 42 therebetween, in the same manner as described above, stress acts on the third polysilicon layer 30A (the third resistance element 30) in the compression direction, and the resistance value of the third polysilicon layer 30A (the third resistance element 30) rises.

Here, the stress that is applied by the second metal layer 31 to the third polysilicon layer 30A (the third resistance element 30) in the compression direction is smaller than the stress that is applied by the first metal layer 21 to the second polysilicon layer 20A (the second resistance element 20) in the compression direction. This is because, whereas two layers—the first interlayer insulation film 41 and the second interlayer insulation film 42 are interposed between the second metal layer 31 and the third polysilicon layer 30A (the third resistance element 30), only one layer (the first interlayer insulation film 41) is interposed between the first metal layer 21 and the second polysilicon layer 20A (the second resistance element 20). Therefore, the stress that is applied in the compression direction to the third polysilicon layer 30A (the third resistance element 30) by the second metal layer 31 is moderated by an amount corresponding to the interposition of the second interlayer insulation film 42.

Therefore, the resistance value rise of the third resistance element 30 (the third polysilicon layer 30A) is smaller than the resistance value rise of the second resistance element 20 (the second polysilicon layer 20A).

Thus, even though impurity amounts in the polysilicon layers are the same, the first resistance element 10, the second resistance element 20 and the third resistance element 30 have different resistance values from one another. The first resistance element 10, the second resistance element 20 and the third resistance element 30 are resistance elements with resistance values ascending in the order: the second resistance element 20, the third resistance element 30, the first resistance element 10.

Thus, the semiconductor device 101 according to the present exemplary embodiment is a semiconductor device including plural resistance elements that are formed of plural polysilicon layers with matching impurity amounts and that have different resistance values.

Further, in the semiconductor device 101 according to the present exemplary embodiment, the plural resistance elements with different resistance values may be formed by forming the first metal layer 21 and the second metal layer 31 so as to cover target resistance elements with interlayer insulation films therebetween. Therefore, the semiconductor device including plural resistance elements with different resistance values may be fabricated simply and at low cost.

Here, in the semiconductor device 101, according to the present exemplary embodiment, a case in which three resistance elements formed of polysilicon layers are provided, has been described. However, the present invention is not limited thereto. For example, four or more resistance elements may be provided. Even in this case where four or more resistance elements are provided, a semiconductor device including plural resistance elements with different resistance values may similarly be achieved by repeating the configuration described above.

Moreover, in the semiconductor device 101, according to the present exemplary embodiment, a case in which wiring layers and metal layers are formed to be separate and independent, has been described. However, the present invention is not limited thereto. A case in which the wiring layers are combined with the metal layers may be possible.

Further, in the semiconductor device 101 according to the present exemplary embodiment, a case in which the first resistance element 10 at which a metal layer is not formed over the resistance element with an interlayer insulation film therebetween is provided, has been described. However, the present invention is not limited thereto. A case in which the first resistance element 10 is not provided, and metal layers are formed over all the resistance elements with interlayer insulation films therebetween, may be possible.

In this case, because metal layers are formed over all the resistance elements with interlayer insulation films therebetween, if an interlayer insulation film is formed so as to cover all the metal layers after the metal layers have been formed, there is no restriction on regions of formation of a wiring layer to be formed on this interlayer insulation film.

This is because, if a wiring layer constituted of the same kind of material as a metal layer are formed with (an) interlayer insulation film(s) therebetween, over a resistance element on which a metal layer is not formed, the resistance value of the resistance element rises and a target resistance value may not be obtained. In contrast, when a wiring layer is formed over a resistance element on which a metal layer is formed, a large proportion of stress is accounted for by the metal layer being applied on the resistance element (the polysilicon layer). Therefore, even when a further wiring layer is formed above the resistance element with (an) interlayer insulation film(s) therebetween, the effect of stress from this wiring layer may be made small, and a rise of the resistance value of the resistance element is less likely to occur.

[Second Exemplary Embodiment]

Figure 11:
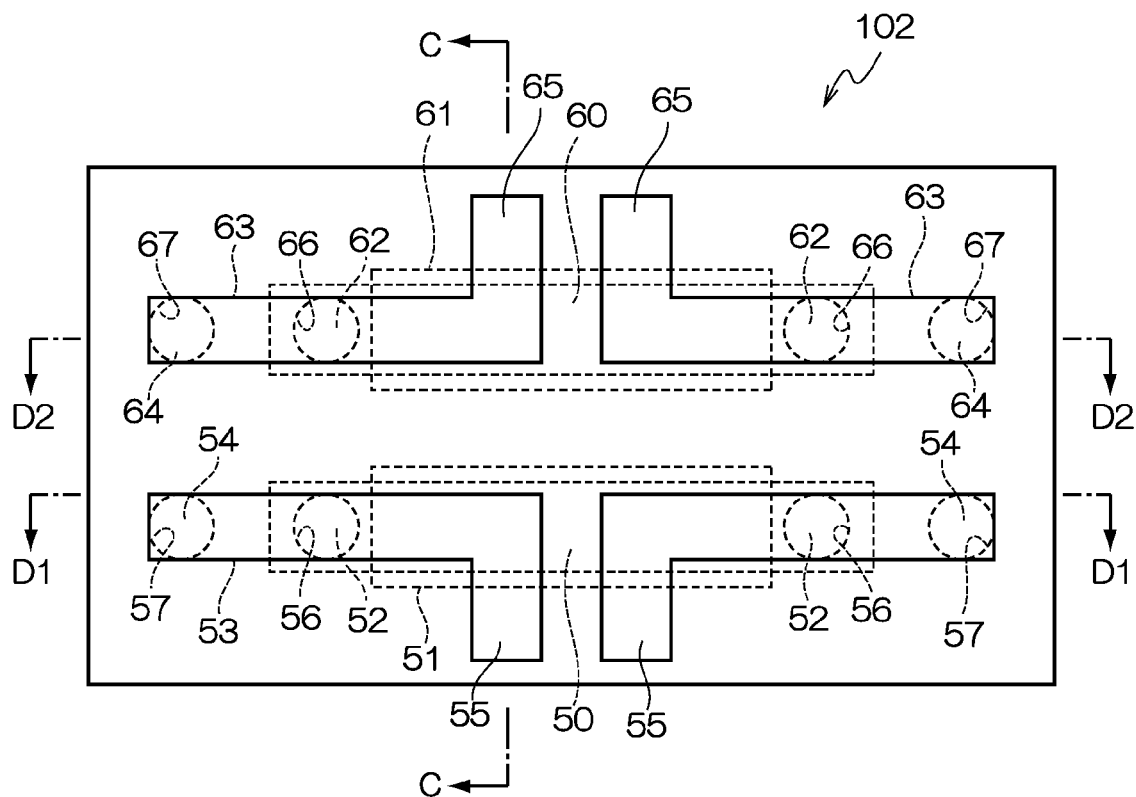
FIG. 11 is a schematic plan view illustrating a semiconductor device according to a second exemplary embodiment.
Figure 12:
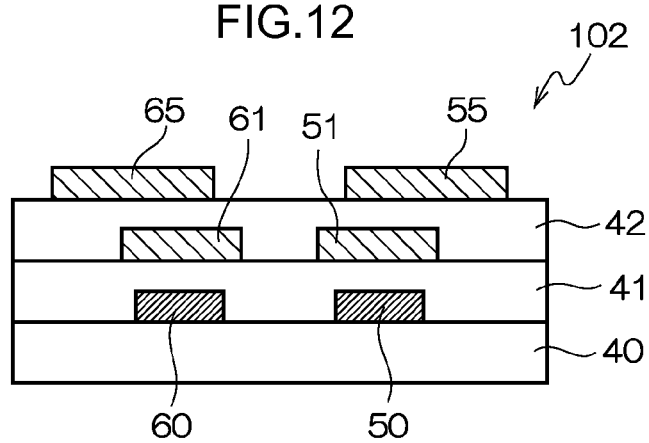
FIG. 12 is a schematic sectional diagram illustrating the semiconductor device according to the second exemplary embodiment.
Figure 13:
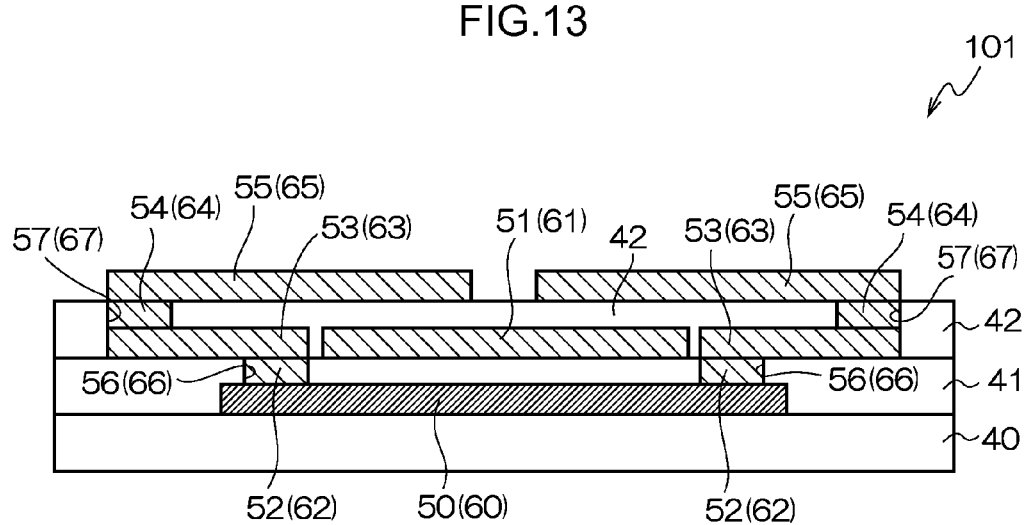
FIG. 13 is a schematic sectional diagram illustrating the semiconductor device according to the second exemplary embodiment.

FIG. 11 is a schematic plan view illustrating a semiconductor device according to the second exemplary embodiment. FIG. 12 is a schematic sectional diagram illustrating the semiconductor device according to the second exemplary embodiment. FIG. 13 is a schematic sectional diagram illustrating the semiconductor device according to the second exemplary embodiment.

FIG. 12 shows a schematic sectional diagram taken along line C-C of FIG. 11. FIG. 13 shows a schematic sectional diagram taken along line D1-D1 or line D2-D2 of FIG. 11.

As illustrated in FIG. 11 to FIG. 13, a semiconductor device 102 according to the second exemplary embodiment is provided with a first resistance element 50 and a second resistance element 60 on the same face of a semiconductor substrate 40 (for example, a polysilicon substrate). The first resistance element 50 is formed of a strip-form first polysilicon layer 50A, and the second resistance element 60 is formed of a strip-form second polysilicon layer 60A.

The first polysilicon layer 50A structuring the first resistance element 50 and the second polysilicon layer 60A structuring the second resistance element 60 are both doped with impurities for resistance adjustment (impurity ions which are, for example, phosphorus ions ($P^+$) or the like).

The first polysilicon layer 50A structuring the first resistance element 50 and the second polysilicon layer 60A structuring the second resistance element 60 may have equal amounts of impurities (impurity densities) and may have different amounts, and each contains impurities such that target resistance values are produced.

The first interlayer insulation film 41 is formed on the semiconductor substrate 40 (for example, a silicon substrate) so as to cover the first resistance element 50 and the second resistance element 60.

Two contact holes 56 are provided so as to penetrate through the first interlayer insulation film 41. The contact holes 56 are for enabling electrical connection with two length direction end portions of the first resistance element 50. The interiors of the contact holes 56 are filled in with metal materials 52 (for example, tungsten (W), copper (Cu), aluminum (Al) or the like). Wiring layers 53 are provided on the first interlayer insulation film 41 so as to connect with the metal materials 52.

Similarly, two contact holes 66 are provided so as to penetrate through the first interlayer insulation film 41. The contact holes 66 are for enabling electrical connection with two length direction end portions of the second resistance element 60. The interiors of the contact holes 66 are filled in with metal materials 62 (for example, tungsten (W), copper (Cu), aluminum (Al) or the like). Wiring layers 63 are provided on the first interlayer insulation film 41 so as to connect with the metal materials 62.

The wiring layers 53 and 63 are provided, for example, on the first interlayer insulation film 41 so as to extend over regions that exclude regions of the first resistance element 50 and second resistance element 60 that are sandwiched between the respective pairs of length direction end portions.

On the first interlayer insulation film 41, metal layers 51 and 61 (for example, layers of tungsten (W), copper (Cu), aluminum (Al) or the like) are provided so as to cover only the first resistance element 50 and the second resistance element 60, respectively, with the first interlayer insulation film 41 therebetween.

Specifically, the metal layers 51 and 61 are provided so as to cover over regions of the first resistance element 50 and second resistance element 60, respectively, that function as resistance elements, which are the regions sandwiched by the pairs of length direction end portions at which the contact holes 56 and 66 are provided. The metal layers 51 and 61 are provided such that widths thereof are wider than the first resistance element 50 (the first polysilicon layer 50A) and second resistance element 60 and cover only the first resistance element 50 and second resistance element 60, respectively, with the first interlayer insulation film 41 therebetween. In other words, the metal layers 51 and 61 are provided so as to be superimposed, if projected in the direction of layering of the layers, with the regions of the first resistance element 50 and second resistance element 60, respectively, that are sandwiched by the pairs of length direction end portions at which the contact holes 56 and 66 are provided.

The metal layers 51 and 61 are provided to be separate from the wiring layers 53 and 63.

The metal layers 51 and 61 may be constituted of the same material as the wiring layers 53 and 63, but may be different.

With the metal layers 51 and 61, the second interlayer insulation film 42 is provided on the first interlayer insulation film 41 so as to cover the wiring layers 53 and 63. Namely, the second interlayer insulation film 42 is provided both so as to cover the first resistance element 50 and the second resistance element 60 with the first interlayer insulation film 41 therebetween, and so as to cover the metal layers 51 and 61 and the wiring layers 53 and 63.

Contact holes 57 are respectively provided so as to penetrate through the second interlayer insulation film 42. The contact holes 57 are for enabling electrical connections with the two wiring layers 53 (the wiring layers 53 electrically connected to the first resistance element 50). The interiors of the contact holes 57 are filled in with metal materials 54 (for example, tungsten (W), copper (Cu), aluminum (Al) or the like). Wiring layers 55 are provided on the second interlayer insulation film 42 so as to connect with the metal materials 54.

Similarly, contact holes 67 are respectively provided so as to penetrate through the second interlayer insulation film 42. The contact holes 67 are for enabling electrical connections with the two wiring layers 63 (the wiring layers 63 electrically connected to the second resistance element 60). The interiors of the contact holes 67 are filled in with metal materials 64 (for example, tungsten (W), copper (Cu), aluminum (Al) or the like). Wiring layers 65 are provided on the second interlayer insulation film 42 so as to connect with the metal materials 64.

On the second interlayer insulation film 42, an interlayer insulation film (not illustrated including) contact holes formed therein, a wiring layer, and suchlike, may be further formed.

Next, a fabrication method of the semiconductor device according to the second exemplary embodiment is described.

FIG. 14A to FIG. 15C are process diagrams illustrating the semiconductor device fabrication method according to the second exemplary embodiment. FIG. 14A to FIG. 15C are process diagrams corresponding to sectional views taken along line D1-D1 or line D2-D2 of FIG. 11.

Figure 14A:
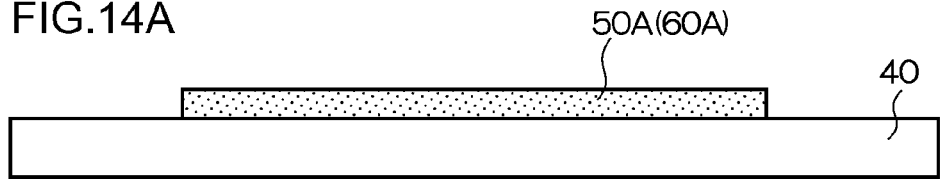
FIG. 14A to FIG. 14E are process diagrams illustrating a semiconductor device fabrication method according to the second exemplary embodiment.

Firstly, as illustrated in FIG. 14A, the semiconductor substrate 40 (for example, a silicon substrate) is prepared. Then, polysilicon is deposited by low-pressure chemical vapor deposition (LP-CVD), and is formed into a layer on a predetermined region of the semiconductor substrate 40. Thereafter, on the formed layer, patterning is performed by photolithography and etching, and accordingly, the strip-form first polysilicon layer 50A and the strip-form second polysilicon layer 60A are formed.

Figure 14B:

Next, as illustrated in FIG. 14B, patterning is performed on the semiconductor substrate 40 by photolithography and etching, and a resist layer with predetermined apertures is formed. Thereafter, impurities (impurity ions which are, for example, phosphorus ions ($P^+$) or the like) are injected into the strip-form first polysilicon layer 50A and the strip-form second polysilicon layer 60A, with the resist layer serving as a mask (an implantation mask). If the resistance values of the resistance elements are to be made equal, this impurity doping is performed once, under the same conditions for each polysilicon layer. On the other hand, if the resistance values of the resistance elements are to be made different, this impurity doping is performed with the conditions being changed for each polysilicon layer, by changing the mask (implantation mask).

Figure 14C:
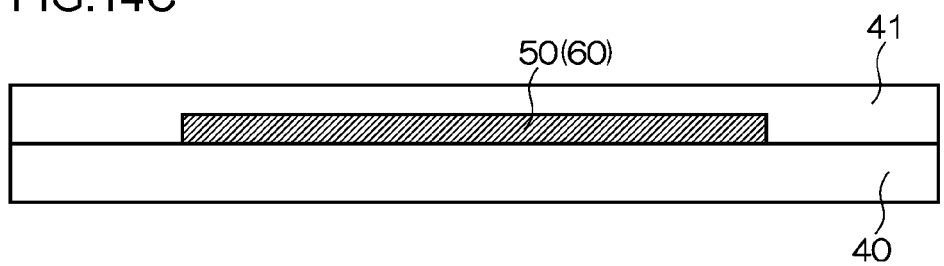

Next, as illustrated in FIG. 14C, the first interlayer insulation film 41 is formed on the semiconductor substrate 40 by, for example, vapor deposition of, for example, a phosphorus-containing silicon oxide layer (a PSG layer) or the like, so as to cover the first resistance element 50 (the first polysilicon layer 50A) and the second resistance element 60 (the second polysilicon layer 60A).

Figure 14D:
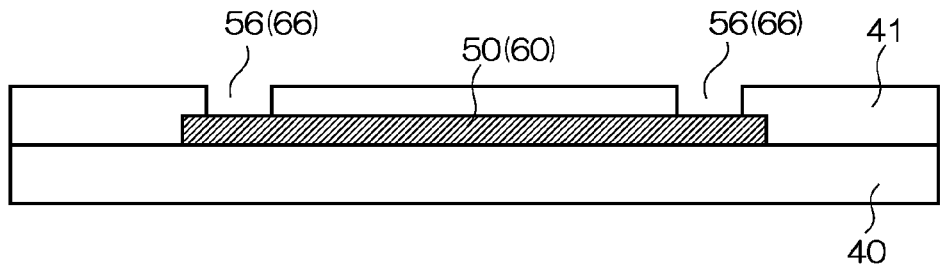

Then, as illustrated in FIG. 14D, the contact holes 56 are formed in the first interlayer insulation film 41 by photolithography and etching, so as to enable contacts with the two length direction end portions of the first resistance element 50 (the first polysilicon layer 50A).

At the same time, the contact holes 66 are formed in the first interlayer insulation film 41 by photolithography and etching, so as to enable contacts with the two length direction end portions of the second resistance element 60 (the second polysilicon layer 60A).

Figure 14E:
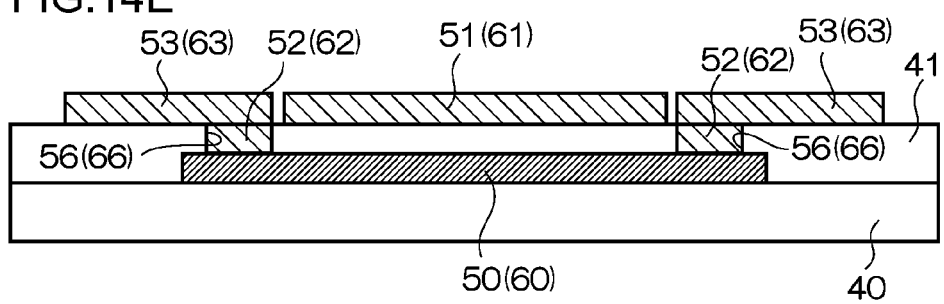

Next, as illustrated in FIG. 14E, the contact holes 56 and 66 formed in the first interlayer insulation film 41 are filled in with the metal materials 52 and 62 (for example, tungsten (W), copper (Cu), aluminum (Al) or the like), respectively, by chemical vapor deposition (CVD), sputtering or the like. Then, a metal material (for example, tungsten (W), copper (Cu), aluminum (Al) or the like) is deposited on the first interlayer insulation film 41 to form a layer. Thereafter, the layer of metal material deposited on the first interlayer insulation film 41 is subjected to patterning by photolithography and etching, and the wiring layers 53 and 63 are formed.

When this patterning of the layer of metal material deposited on the first interlayer insulation film 41 is carried out, the patterning is carried out such that regions covering only the first resistance element 50 and the second resistance element 60, with the first interlayer insulation film 41 therebetween, remain. This remaining layer of the metal material is the metal layers 51 and 61.

Figure 15A:
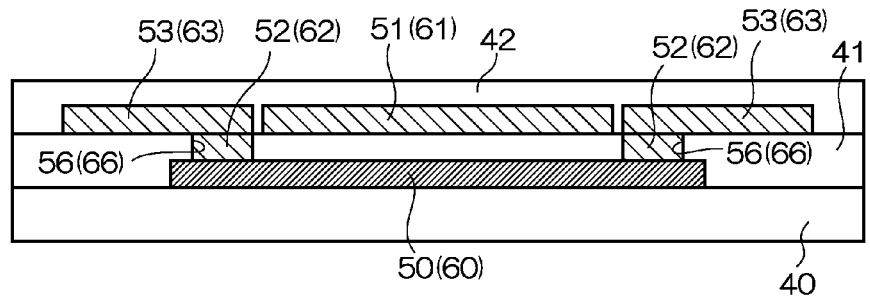
FIG. 15A to FIG. 15C are process diagrams illustrating the semiconductor device fabrication method according to the second exemplary embodiment.

Next, as illustrated in FIG. 15A, the second interlayer insulation film 42 is formed on the first interlayer insulation film 41 by, for example, vapor deposition of, for example, a phosphorus-containing silicon oxide layer (a PSG layer) or the like, so as to cover both the metal layers 51 and 61 and the wiring layers 53 and 63.

Figure 15B:
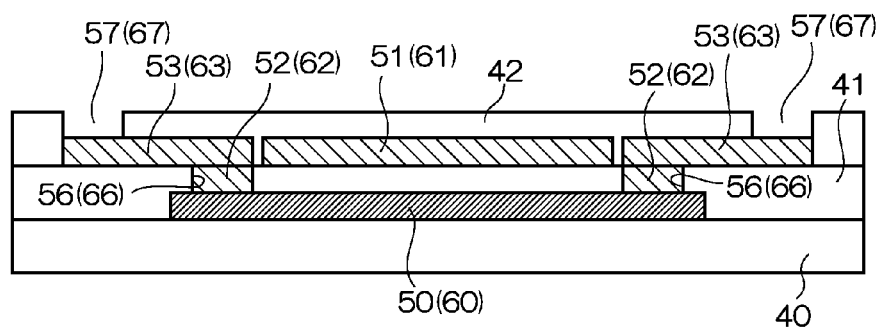

Then, as illustrated in FIG. 15B, the contact holes 57 are formed in the second interlayer insulation film 42 by photolithography and etching, so as to enable electrical contacts with the two wiring layers 53 (the wiring layers 53 electrically connected to the first resistance element 50).

At the same time, the contact holes 67 are formed in the first interlayer insulation film 41 by photolithography and etching, so as to enable contacts with the two wiring layers 63 (the wiring layers 63 electrically connected to the second resistance element 60).

Figure 15C:
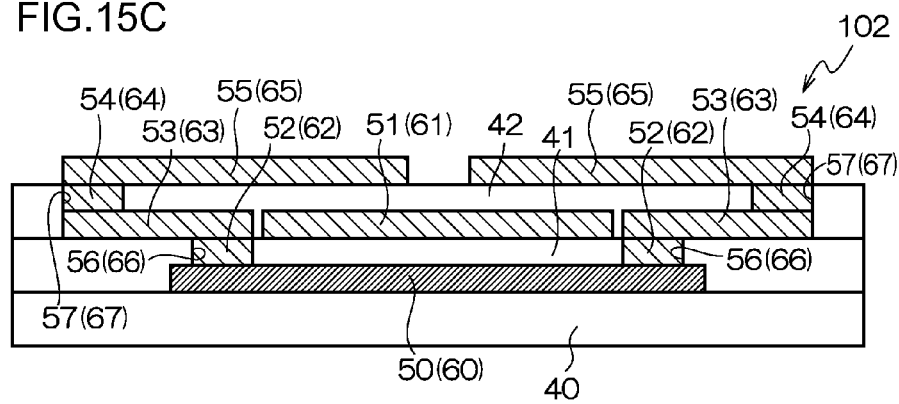

Next, as illustrated in FIG. 15C, the contact holes 57 and 67 formed in the second interlayer insulation film 42 are filled in with the metal materials 54 and 64 (for example, tungsten (W), copper (Cu), aluminum (Al) or the like), respectively, by chemical vapor deposition (CVD), sputtering or the like. Then a metal material (for example, tungsten (W), copper (Cu), aluminum (Al) or the like) is deposited on the second interlayer insulation film 42 to form a layer. Thereafter, the layer of metal material deposited on the second interlayer insulation film 42 is subjected to patterning by photolithography and etching, and the wiring layers 55 and 65 are formed.

Thereafter, if required, an interlayer insulation layer may be formed on the second interlayer insulation film 42 and further contact holes, wiring layers and the like may be formed.

By the steps described above, the semiconductor device 102 according to the present exemplary embodiment is fabricated.

The above described semiconductor device 102 according to the second exemplary embodiment is provided with the first resistance element 50 formed of the first polysilicon layer 50A containing impurities, and the second resistance element 60 formed of the second polysilicon layer 60A containing impurities.

The metal layers 51 and 61 are provided on the first interlayer insulation film 41 to cover the first polysilicon layer 50A (the first resistance element 50) and the second polysilicon layer 60A (the second resistance element 60), with the first interlayer insulation film 41 therebetween.

When the metal layers 51 and 61 are formed over the first polysilicon layer 50A (the first resistance element 50) and the second polysilicon layer 60A (the second resistance element 60) with the first interlayer insulation film 41 therebetween, stresses act on the first polysilicon layer 50A (the first resistance element 50) and the second polysilicon layer 60A (the second resistance element 60) in the direction of compression. In the case of polysilicon, when stress acts in the compression direction, if the carriers are electrons, electron mobility decreases and consequently the resistance value of the second resistance element 60 (the second polysilicon layer 60A) rises.

Alternatively, if a wiring layer constituted of the same kind of material as a metal layer is formed over a resistance element with (an) interlayer insulation film(s) therebetween on which a metal layer is not formed, the resistance value of the resistance element rises, and a target resistance value may not be obtained.

In contrast, in the semiconductor device 102 according to the second exemplary embodiment, the metal layers 51 and 61 are formed over every polysilicon layer (semiconductor element), the first polysilicon layer 50A (the first resistance element 50) and the 60A (the second resistance element 60), with the first interlayer insulation film 41 therebetween.

Thus, when the metal layers 51 and 61 are formed over the resistance elements, a large proportion of stress is accounted by the metal layers 51 and 61 being applied on the resistance elements (the polysilicon layers). Therefore, even when the further wiring layers 55 and 65 are formed above the resistance elements with the second interlayer insulation film 42 therebetween, the effect of stresses from these wiring layers 55 and 65 is small, and rise of the resistance value of the resistance elements are less likely to occur.

Therefore, the wiring layers 55 and 65 may be formed in a layer above the metal layers 51 and 61, without resistance value rises of the resistance elements.

Thus, the semiconductor device 102 according to the present exemplary embodiment may dispose the wiring layers without being limited in the regions of arrangement.

Here, in the semiconductor device 102 according to the present exemplary embodiment, a case in which two resistance elements formed of polysilicon layers are provided, has been described. However, the present invention is not limited thereto. For example, cases in which one resistance element or three or more resistance elements are provided, may be possible.

Moreover, in the semiconductor device 102 according to the present exemplary embodiment, a case in which wiring layers and metal layers are formed to be separate and independent, has been described. However, the present invention is not to be limited thereto. Cases in which the wiring layers are combined with the metal layers, may be possible.

The semiconductor devices according to the first and second exemplary embodiments described hereabove are not to be understood as limiting, and may be implemented within a technical scope that satisfies the requirements of the present invention.

What is claimed is:

1. A semiconductor device comprising:
   a first resistance element that has a first resistance value and is formed of a first polysilicon layer that contains impurities; and
   a second resistance element that has a second resistance value that differs from the first resistance value, the second resistance element including
      a second polysilicon layer provided on a same surface as the first polysilicon layer, and that contains an equal amount of impurities as the first polysilicon layer,
      a first interlayer insulation film provided so as to cover the first polysilicon layer and the second polysilicon layer, and
      a first metal layer provided on the first interlayer insulation film so as to cover the second polysilicon layer with the first interlayer insulation film disposed therebetween.

2. The semiconductor device according to claim 1, further comprising:
   a third resistance element that has a third resistance value that differs from the first and second resistance values, the third resistance element including
      a third polysilicon layer provided on the same surface as the first polysilicon layer, and that contains an equal amount of impurities as the first polysilicon layer, the third polysilicon layer, with the first polysilicon layer and the second polysilicon layer, being covered by the first interlayer insulation film,
      a second interlayer insulation film provided so as to cover the first polysilicon layer, the second polysilicon layer, and the third polysilicon layer with the first, interlayer insulation film disposed therebetween, and so as to cover the first metal layer and
      a second metal layer provided on the second interlayer insulation film so as to cover the third polysilicon layer, with the first interlayer insulation film and the second interlayer insulation film disposed therebetween.

3. The semiconductor device according to claim 2, further comprising:
   a third interlayer insulation film provided so as to cover the first polysilicon layer, the second polysilicon layer, and third polysilicon layer, with the first interlayer insulation film and the second interlayer insulation film disposed therebetween, and so as to cover the first metal layer and the second metal layer; and
   a wiring layer provided so as to cover the second metal layer with the third interlayer insulation film disposed therebetween.

4. The semiconductor device according to claim 3, wherein the first metal layer, the second metal layer, and the wiring layer are constituted of the same material.

5. The semiconductor device according to claim 1, further comprising:
   a second interlayer insulation film provided so as to cover the first polysilicon layer and the second polysilicon layer with the first interlayer insulation film disposed therebetween, and so as to cover the first metal layer; and a second metal layer provided on the second interlayer insulation film so as to cover the first polysilicon layer, with the first interlayer insulation film and the second interlayer insulation film disposed therebetween.

6. The semiconductor device according to claim 5, further comprising:
   a third interlayer insulation film provided so as to cover the first polysilicon layer and the second polysilicon layer with the first interlayer insulation film and the second interlayer insulation film disposed therebetween, and so as to cover the first metal layer and the second metal layer; and
   a wiring layer provided so as to cover the second metal layer with the third interlayer insulation film disposed therebetween.

7. The semiconductor device according to claim 6, wherein the first metal layer, the second metal layer, and the wiring layer are constituted of the same material.

8. The semiconductor device according to claim 1, further comprising:
   a second interlayer insulation film provided so as to cover the first polysilicon layer and the second polysilicon layer with the first interlayer insulation film disposed therebetween, and so as to cover the first metal layer; and
   a wiring layer provided so as to cover the first metal layer with the second interlayer insulation film disposed therebetween.

9. The semiconductor device according to claim 8, wherein the first metal layer and the wiring layer are constituted of the same material.

10. A semiconductor device fabrication method comprising:
   a polysilicon layer formation step of forming a first polysilicon layer and a second polysilicon layer on a same surface;
   a first resistance element formation step of forming a first resistance element formed of the first polysilicon layer and containing impurities and that has a first resistance value by respectively doping the first polysilicon layer and the second polysilicon layer with the impurities under identical conditions; and
   a second resistance element formation step of forming a second resistance element that has a second resistance value that differs from the first resistance value, the formation of the second resistance element comprising
      a first interlayer insulation film formation step of forming a first interlayer insulation film so as to cover the first polysilicon layer and the second polysilicon layer, and
      a first metal layer formation step of forming a first metal layer on the first interlayer insulation film so as to cover the second polysilicon layer with the first interlayer insulation film disposed therebetween.

11. The semiconductor device fabrication method according to claim 10, wherein
   the polysilicon layer formation step further comprises forming a third polysilicon layer together with the first polysilicon layer and the second polysilicon layer on the same surface,
   the first resistance element formation step further comprises respectively doping the third polysilicon layer, together with the first polysilicon layer and the second polysilicon layer, with impurities under the identical conditions,
   the first interlayer insulation film formation step further comprises forming the first interlayer insulation film so as to cover the third polysilicon layer together with the first polysilicon layer and the second polysilicon layer, and
   the semiconductor device fabrication method further includes:
   a third resistance element formation step of forming a third resistance element that has a third resistance value that differs from the first and second resistance values, the formation of the third resistance element comprising
      a second interlayer insulation film formation step of forming a second interlayer insulation film so as to cover the first polysilicon layer, the second polysilicon layer and the third polysilicon layer, with the first interlayer insulation film disposed therebetween, and so as to cover the first metal layer, and
      a second metal layer formation step of forming a second metal layer on the second interlayer insulation film so as to cover the third polysilicon layer, with the first interlayer insulation film and the second interlayer insulation film disposed therebetween.

12. The semiconductor device fabrication method according to claim 11, further comprising:
   a third interlayer insulation film formation step of forming a third interlayer insulation film so as to cover the first polysilicon layer, the second polysilicon layer, and third polysilicon layer, with the first interlayer insulation film and the second interlayer insulation film disposed therebetween, and so as to cover the first metal layer and the second metal layer; and
   a step of forming a wiring layer so as to cover the second metal layer with the third interlayer insulation film disposed therebetween.

13. The semiconductor device fabrication method according to claim 12, wherein the first metal layer, the second metal layer, and the wiring layer are constituted of the same material.

14. The semiconductor device fabrication method according to claim 10 further comprising:
   a second interlayer insulation film formation step of forming a second interlayer insulation film so as to cover the first polysilicon layer and the second polysilicon layer with the first interlayer insulation film disposed therebetween, and so as to cover the first metal layer; and
   a second metal layer formation step of forming a second metal layer on the second interlayer insulation film so as to cover the first polysilicon layer, with the first interlayer insulation film and the second interlayer insulation film disposed therebetween.

15. The semiconductor device fabrication method according to claim 12, further comprising:
   a third interlayer insulation film formation step of forming a third interlayer insulation provided so as to cover the first polysilicon layer and the second polysilicon layer with the first interlayer insulation film and the second interlayer insulation film disposed therebetween, and so as to cover the first metal layer and the second metal layer; and
   a step of forming a wiring layer so as to cover the second metal layer with the third interlayer insulation film disposed therebetween.

16. The semiconductor device fabrication method according to claim 15, wherein the first metal layer, the second metal layer, and the wiring layer are constituted of the same material.

17. The semiconductor device fabrication method according to claim 10, further comprising:

a second interlayer insulation film formation step of forming a second interlayer insulation film so as to cover the first polysilicon layer and the second polysilicon layer with the first interlayer insulation film disposed therebetween, and so as to cover the first metal layer; and a step of forming a wiring layer so as to cover the first metal layer with the second interlayer insulation film disposed therebetween.

18. The semiconductor device fabrication method according to claim 17, wherein the first metal layer and the wiring layer are constituted of the same material.

19. A semiconductor device comprising:

a plurality of resistance elements each including a polysilicon layer containing impurities that is formed in an island shape on a semiconductor substrate, one or more interlayer insulation films provided so as to cover the polysilicon layer, a metal layer selectively formed on the one or more interlayer insulation films so as to cover the polysilicon layer with the interlayer insulation films disposed therebetween, and a wiring layer that electrically connects the polysilicon layer via contact holes, wherein a resistance value of each of the plurality of resistance elements is determined by the number of layers of the interlayer insulation films and by the presence or absence of the metal layer above each of the polysilicon layers.

* * * * *